(12) United States Patent
Tada et al.

(10) Patent No.: US 6,528,942 B1
(45) Date of Patent: Mar. 4, 2003

(54) ORGANIC ELECTROLUMINESCENCE DEVICE, ITS MANUFACTURING METHOD AND BOARD FOR DISPLAY DEVICE USED THEREFOR

(75) Inventors: Kazuya Tada, Hyogo (JP); Mitsuyoshi Onoda, Hyogo (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/394,436

(22) Filed: Sep. 13, 1999

(30) Foreign Application Priority Data

Jul. 13, 1999 (JP) ............................. 11-199225

(51) Int. Cl.[7] ............................................. H05B 33/00
(52) U.S. Cl. ....................... 313/506; 313/503; 428/917
(58) Field of Search ................................ 313/506, 503, 313/504; 428/917, 690; 315/169.3

(56) References Cited

U.S. PATENT DOCUMENTS 5,621,069 A * 4/1997 Galvin-Donoghue et al. ...................... 313/503 X
5,756,224 A * 5/1998 Bornet et al. ........... 313/504 X
5,955,836 A * 9/1999 Borner et al. ................ 313/506

OTHER PUBLICATIONS

Kazuya Tada, et al.; "Optical Patterning of Polymer Light–Emitting Device"; Japanese Journal of Applied Physics; vol. 37 (1998) pp. L1181–L1182.

* cited by examiner

Primary Examiner—Ashok Patel
(74) Attorney, Agent, or Firm—Morgan, Lewis & Bockius LLP

(57) ABSTRACT

An organic electroluminescence (EL) device having an image pattern includes a substrate, a first electrode formed on the substrate, a light emitting layer formed on the first electrode and a second electrode which is formed on the light emitting layer and oxygen-transmittable. The light-emitting layer includes an oxide layer selectively formed by the selective photo-oxidation using light and oxygen reached through the second electrode. The oxide layer serves as a non-light-emitting region. In such a configuration, the reliable organic EL device with high contrast can be provided in a short time from its order to completion.

14 Claims, 7 Drawing Sheets

ORGANIC ELECTROLUMINESCENCE DEVICE, ITS MANUFACTURING METHOD AND BOARD FOR DISPLAY DEVICE USED THEREFOR

BACKGROUND OF THE INVENTION

1. Field of the Invention

The present invention related to an organic electroluminescence device, its manufacturing method and a board used therefor, and more particularly to its pattern formation.

2. Description of the Related Art

An electroluminescence (EL) device has been used as various kinds of display devices or light sources, a back light for a liquid crystal display, a light emitting device in an optical communication device, etc. The EL device is a light emitting device using electric-field light-emission of a solid fluorescent material. It is now actually used in the form of an inorganic EL device which uses an inorganic material as a light emitting material, and being developed in various applications inclusive of a back light for the liquid crystal display, flat display, etc. However, the inorganic EL device, which requires a high voltage of 100 V or more for light emission and difficult to emit blue light, has been difficult to implement its full-color display using three RGB primary colors.

On the other hand, various studies have been also made for the EL device using an organic material. However, because of its poor efficiency of light emission, it has not been put into real practice. In recent years, the EL device having a function-separating type of a laminated structure has been proposed in which the organic material is separated into a hole transporting layer and a light emitting layer. It has been verified that the organic EL can provide high luminance at a low voltage of 10 V or lower. Since then, the organic EL device has drawn great attention. Also now, the organic EL device having a function-separating type of separation structure is being studied widely.

An explanation will be given of the structure and operation of an ordinary EL device. The EL device has a laminated structure composed of a first electrode formed on the surface of a transparent glass substrate by sputtering or resistive-heating evaporation technique, a light emitting layer formed thereon and a second electrode formed thereon by a vacuum evaporation technique. The first electrode is made of a transparent conductive material such as indium tin oxide (ITO). The light emitting layer is made of poly (2-methoxy-5-dodecyloxy-p-phenylene vinylene) (hereinafter referred to as MDOPPV). The second electrode is made of metal such as Aluminum (Al).

In operation, when a DC voltage is applied to the EL device having such a structure, holes are injected from the first electrode into the light emitting layer, and electrons are injected from the second electrode into the light emitting layer. The recombination of holes and electrons occurs in the light emitting layer. When the exitons thus created decay from an excited state to a ground state, the phenomenon of light emission occurs. A various light emission color can be obtained by changing the molecular structure of an organic compound.

Meanwhile, it is known that the property of the polymer such as MDOPPV used for this light emitting layer varies drastically by photo-oxidation. Specifically, bleaching of optical absorption is observed, which is whitening corresponding to the inter-band transition which is attributable to shortening of the effective $\pi$ conjugated length and reduction of the molecular weight. In this way, extinction of photoluminescence by the photo-irradiation in the air has been studied. The light extinction is due to the defect such as a carbonyl group which operates as a light extinction center for light emission species such as exitons or exitons-polarons.

A technique of patterning the EL device using such a phenomenon has been proposed. This technique, however, performs the photo-irradiation for patterning the light-emitting layer in an atmosphere of oxygen prior to forming a second electrode. In this technique, since the second electrode must be formed after the pattern has been formed, when the substrate is heated at a high temperature in a vacuum evaporation step, the device region deteriorates greatly and the light emitting region does not emit light favorably, thus making it impossible to give sufficient contrast.

Further, there is a phenomenon that the center of light extinction is widened so that the non-light-emitting region is extended and the contour of an image is also extended.

Further, since the patterning is completed through the vacuum evaporation step starting from photo-irradiation for forming an image, it takes a long time from determination of an image to be formed to its completion. Namely, the TAT (turn around time) is disadvantageously long. Under such a circumstance, the present invention has been accomplished.

SUMMARY OF THE INVENTION

A first object of the present invention is to provide a reliable organic electroluminescence (EL) device which can provide high contrast.

A second object of the present invention is to provide a method for manufacturing an organic EL device in a short time from its order to completion and with good workability.

A third object of the present invention is to provide a reliable board for a display device which can provide high contrast.

In order to attain the first object, in accordance with a first aspect of the present invention, there is provided an organic electroluminescence device comprising: a substrate; a first electrode formed on the substrate; a light emitting layer formed on the first electrode; and a second electrode formed on the light emitting layer and made of an oxygen-transmittable material, wherein the light-emitting layer includes an oxide layer selectively formed by the selective photo-oxidation using light and oxygen reached through the second electrode, and the oxide layer constitutes (serves as) a non-light-emitting region.

In this configuration, after the second electrode is formed, light-emitting species in a local region in the light emitting layer are extinguished by selective photo-oxidation using oxygen reached through the second electrode. Therefore, a vacuum evaporation step for forming the second electrode is not required after a pattern is formed. Thus, the substrate is not heated to a high temperature and hence a device region is not deteriorated, thereby providing sufficient contrast. In addition, since the vacuum evaporation step is not carried out, a phenomenon owing to the temperature in this step, i.e. that the center of light extinction is extended, the non-light-emitting region is expanded and the contour of an image is expanded, does not occur. Further, since the patterning is completed starting from photo-irradiation for creating an image and through the vacuum evaporation, it can be implemented in a short time from determination of the image to be formed to its completion. The oxide layer may not be formed over the entire depth of the light emitting layer, but may be partially formed therein.

A second aspect of the device is an organic electroluminescence device according to the first aspect wherein the substrate is made of a light-transmittable material and the first electrode is also made of a light transmittable material; and the non-light-emitting region is formed through invasion of oxygen from the side of the second electrode and photo-oxidation based on photo-irradiation from the side of the substrate.

In this configuration, since oxygen is supplied to the light emitting layer from the side of the second electrode and photo-irradiation is done from the side of the substrate, after the pattern is formed, the second electrode is covered with a protective layer so that it is protected from transmittance of oxygen. This permits the life of the electroluminescence device to be lengthened.

A third aspect of the device is an organic electroluminescence device according to the firs aspect, wherein the second electrode is made of a light-transmittable material and the non-light-emitting region is formed by photo-oxidation using light transmitted through the second electrode.

In this configuration, since the second electrode is made of a light-transmittable material and photo-irradiation is done from the side of the second electrode, a mask can be located more closely to the second electrode, thereby improving the pattern accuracy.

A fourth aspect of the device is an organic electroluminescence device according to the first aspect, wherein the second electrode is made of a light-transmittable material, and the non-light-emitting region is formed by photo-oxidation using light transmitted through the second electrode and light from the substrate side.

In this configuration, since patterning can be done through the photo-irradiation from both sides, an image with a clear pattern or clear contour can be obtained with great accuracy.

A fifth aspect of the device is an organic electroluminescence device according to the first aspect, wherein, the second electrode is made of aluminum. The second electrode, which is semi-transparent and permits oxygen to transmit, is more effectively used.

A sixth aspect of the device is an organic electroluminescence device according to the fifth aspect, wherein the second electrode has light transmittance of 30% or higher to visible light. The second electrode is semi-transparent and transmits oxygen so that it can supply a sufficient amount of oxygen and light. Such a second electrode can be more effectively used.

A seventh aspect of the device is an organic electroluminescence device according to the fifth aspect, wherein the second electrode is made of a light-tight conductive film having an opening diameter enough to transmit oxygen molecules. The second electrode can supply a sufficient amount of oxygen and hence can be more effectively used.

A eighth aspect of the device is an organic electroluminescence device, wherein the device comprises: a substrate; a first electrode formed on the substrate; a light emitting layer formed on the first electrode; and a second electrode formed on the light emitting layer; and an oxygen supplying layer which is formed within the light-emitting layer or in the vicinity of the light-emitting layer and can supply oxygen to the light-emitting layer, wherein the light-emitting layer includes an oxide layer selectively formed by the selective photo-oxidation using light and oxygen reached through the second electrode, and the oxidized layer serves as a non-light-emitting region.

In this configuration, since the oxygen supplying layer is provided separately, the selective photo-oxidation can be made without supplying oxygen from the exterior and supply in/out of oxygen is not done, thereby lengthening the life of the organic electroluminescence device.

In order to attain the second object, a ninth aspect of the method is a method of manufacturing an organic electroluminescence device comprising the steps of: forming a first electrode formed on the surface of a substrate; forming a light emitting layer formed on the first electrode; forming a second electrode formed on the light emitting layer to form a sandwiching structure in which the light-emitting layer is sandwiched between the first electrode and the second electrode; and exposing a pattern by selectively irradiating the sandwiching structure with light from the side of the first electrode or second electrode to form a non-light-emitting region of an oxide region through selective photo-oxidation.

A tenth aspect of the method is method of manufacturing an organic electroluminescence device according to the ninth aspect, wherein, the second electrode is made of a light-transmittable porous thin film enough to transmit oxygen and light., and the step of making pattern light-exposure is carried out through photo-oxidation by photo-irradiation from side of the second electrode.

An eleventh aspect of the method is a method of manufacturing an organic electroluminescence device according to the ninth aspect, wherein the second electrode is made of a light transmittable porous thin film having light-transparency enough to transmit oxygen, and the step of making pattern light-exposure is carried out through photo-oxidation by photo-irradiation from the side of the first electrode.

An twelfth aspect of the method is a method of manufacturing an organic electroluminescence device according to the ninth aspect, wherein the first or second electrode, or the light emitting layer includes an oxygen supplying layer which can supply oxygen, and the step of making pattern light-exposure is carried out through photo-oxidation by supply of the oxygen from the oxygen supplying layer.

In order to attain the third object, a thirteenth aspect of the board is a board for a display device of the present invention, comprising: a substrate; a first electrode formed on the substrate; a light emitting layer formed on the first electrode; and a second electrode formed on the light emitting layer, wherein the second electrode is made of a porous thin film enough to transmit oxygen, and the light-emitting layer is designed to provide an oxide layer selectively formed by the selective photo-oxidation using photo-irradiation and oxygen reached through the second electrode, the oxide layer serves as a non-light-emitting region.

A fourteenth aspect of the board is a board for a display device according to the thirteenth aspect, wherein the second electrode is made of a light-transmittable porous thin film enough to transmit oxygen and light, wherein the light-emitting layer:. is designed to provide an oxide layer selectively formed by the selective photo-oxidation using photo-irradiation from the side of the second electrode and oxygen reached through the second electrode, the oxide layer serving as a non-light-emitting region.

A fifteenth aspect of the board is a board for a display device according to the thirteenth aspect, wherein the second electrode is made of a light-tight porous thin film enough to transmit oxygen, the substrate is made of a light-transmittable material, the first electrode is made of a light-transmittable material and the light-emitting layer is designed to provide an oxide layer selectively formed by the selective photo-oxidation using photo-irradiation from the side of the first electrode and oxygen reached through the second electrode, the oxide layer serving as a non-light-emitting region.

A sixteenth aspect of the board is a board for a display device of the present invention which comprises: a substrate; a first electrode formed on the substrate; a light emitting layer formed on the first electrode; a second electrode formed on the light emitting layer; and an oxygen supplying layer which is formed within the light-emitting layer or in the vicinity of the light-emitting layer and can supply oxygen to the light-emitting layer, wherein the light-emitting layer is designed to provide an oxide layer selectively formed by the selective photo-oxidation using photo-irradiation and oxygen reached through the second electrode, the oxide layer serving as a non-light-emitting region.

A seventeen aspect of the board is a board for a display device according to the sixteenth aspect, wherein the second electrode is made of aluminum.

An eighteenth aspect of the board is a board for a display device according to the sixteenth aspect, wherein the second electrode has light transmittance of 30% or higher to visible light.

In accordance with the present invention, after the second electrode is formed, light-emitting species of a local region in the light emitting layer are extinguished by selective photo-oxidation using oxygen reached through the second electrode so that the non-light-emitting region is formed so as to surround a light emitting pattern. Therefore, a vacuum evaporation step for forming the second electrode is not required after the pattern is formed, thereby providing an electroluminescence device with high contrast and with great reliability. The patterning can be carried out very easily and with improve workability.

The basic idea of the present invention is as follows.
(i) The light emitting species created electrically in conductive polymer (emission layer) are extinguished by quenching centor such as the carbonyl group created by photo-oxidation.
(ii) The electric conductivity of the conductive polymer (emission layer) can be reduced by shortening of the effective conjugated length by the photo-oxidation.
(iii) The charge injecting efficiency at an electrode/polymer interface is reduced by the photo-oxidation of the polymer at the interface.

In this structure described above, an image can be printed very easily on the organic electroluminescence device. Therefore, a consumer who purchased a greeting card can print a desired pattern thereon on the basis of the principle similar to a (sunshine) photograph. It can be also applied to a name plate which can be sold at a place such a holiday carpenter center after the desired name is immediately printed. Further, it can be applied to a number plate of a motor car. In this case, the time from its order to delivery can be shortened greatly.

Accordingly, the organic electroluminescence device and board for a display device with high light-emitting efficiency and high contrast can be obtained.

The above and other objects and features of the present invention will be more apparent from the following description taken in conjunction with the accompanying drawings.

DESCRIPTION OF THE PREFERRED EMBODIMENTS

Figure 1:
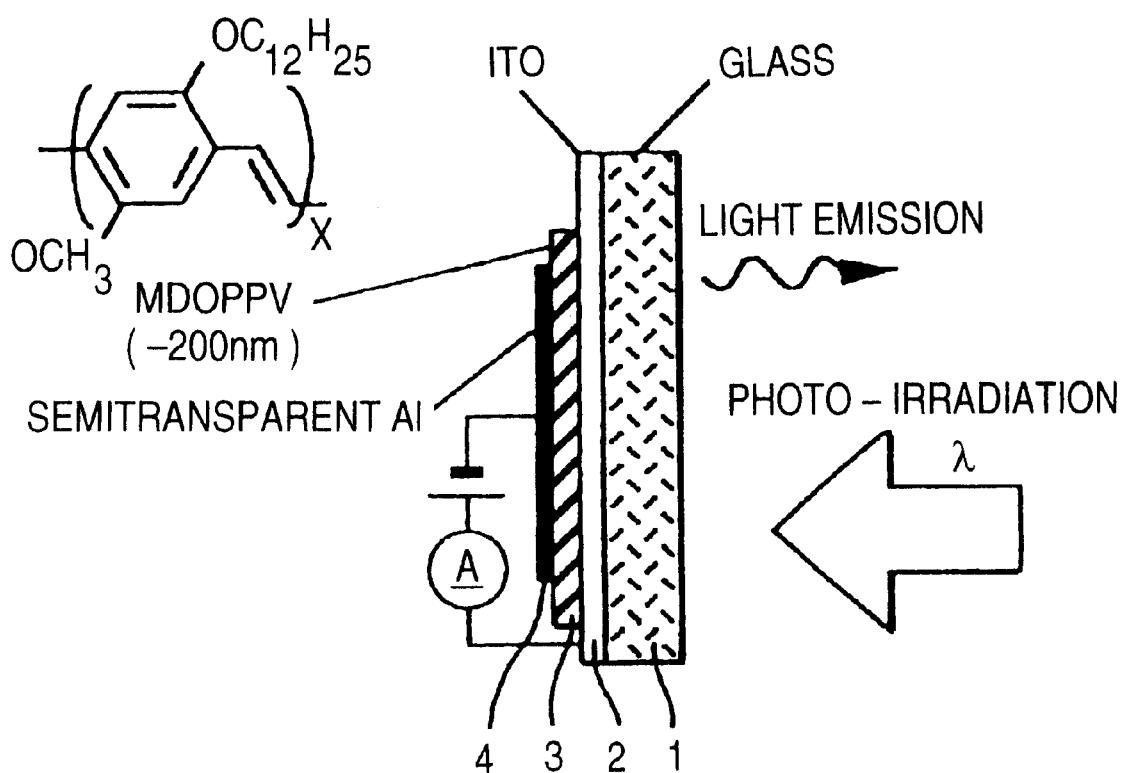
FIG. 1 is a view showing an organic electroluminescence (EL) device according to a first embodiment of the present invention.

Now, referring to the drawings, an explanation will be given of several embodiments of the present invention.

Embodiment 1

An organic EL device according to a first embodiment of the present invention, as shown in FIG. 1, includes a first electrode 2 of indium tin oxide (ITO), a light emitting layer 3 of MDOPPV having a thickness of 200 nm and a second electrode 4 of Al having a thickness of 60 nm, which are successively stacked on the surface of a glass substrate 1 to constitute a display board. The organic EL device is characterized in that a non-light-emitting region is selectively formed on the display board according to a desired pattern exposed by selective photo-oxidation, thereby revealing a desired light emitting pattern on a display screen.

Figure 2A:
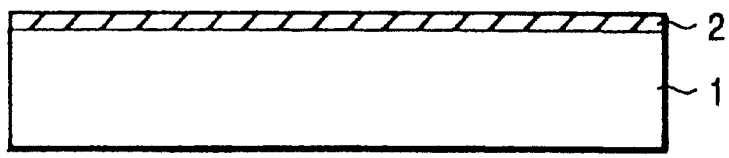
FIGS. 2A to 2D are views showing steps in the process for manufacturing the organic EL device, respectively.
Figure 2B:
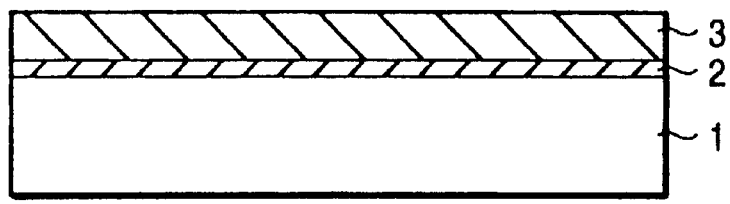

In the process of manufacturing the organic EL device, as seen from the respective steps shown in FIGS. 2A to 2D, first, the glass substrate 1 on which the ITO thin film 2 having 10 Ω/? is prepared. The glass substrate 1 is ultrasonic-cleaned in ethanol, acetone and chloroform, successively, and dried by dried compressed air. On the glass substrate 1 (FIG. 2A), the MDOPPV film 3 (having a thickness of 200 nm) is formed by the spin-coating technique using a chloroform solution having its concentration of 2 mg/ml (FIG. 2B). In this case, the rotary speed of 2000 rpm was adopted.

Thereafter, the glass substrate 1 is mounted on a vacuum evaporation device 1 which is exhausted to the vacuum of $4-6 \times 10^{-6}$ Torr.

Figure 2C:
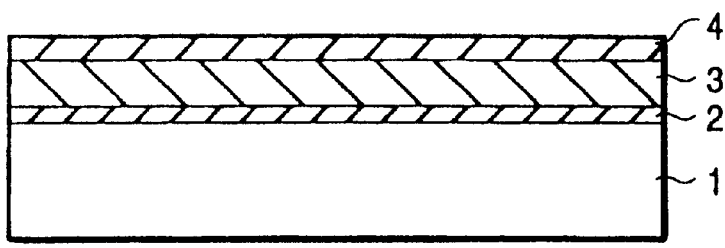

Aluminum which is an evaporation source is heated so that the second electrode 4 of Al having a thickness of 60 nm is formed on the entire surface of the MDOPPV thin film 3 (FIG. 2C). In this case, the deposition speed was set at 0.1–3 nm/sec so that the Al layer 4 is so porous as to transmit oxygen.

Thus, the display board is completed.

Figure 2D:
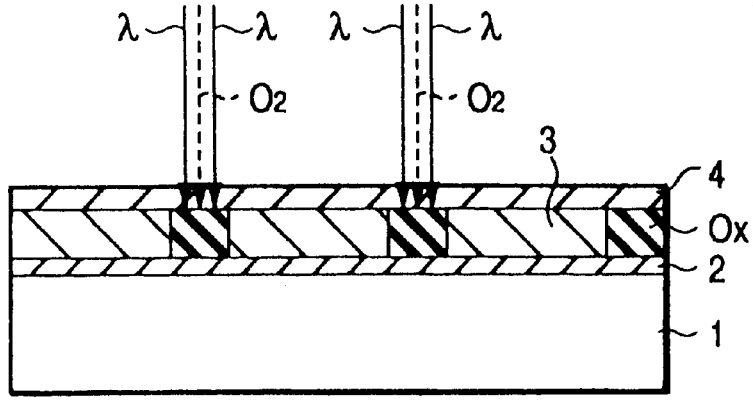

Thereafter, light exposure is made using white light (λ) from a tungsten lamp through a desired mask pattern to cause optical-selective photo-oxidation, thereby forming an oxidized region(s) Ox as shown in FIG. 2D.

Figure 3:
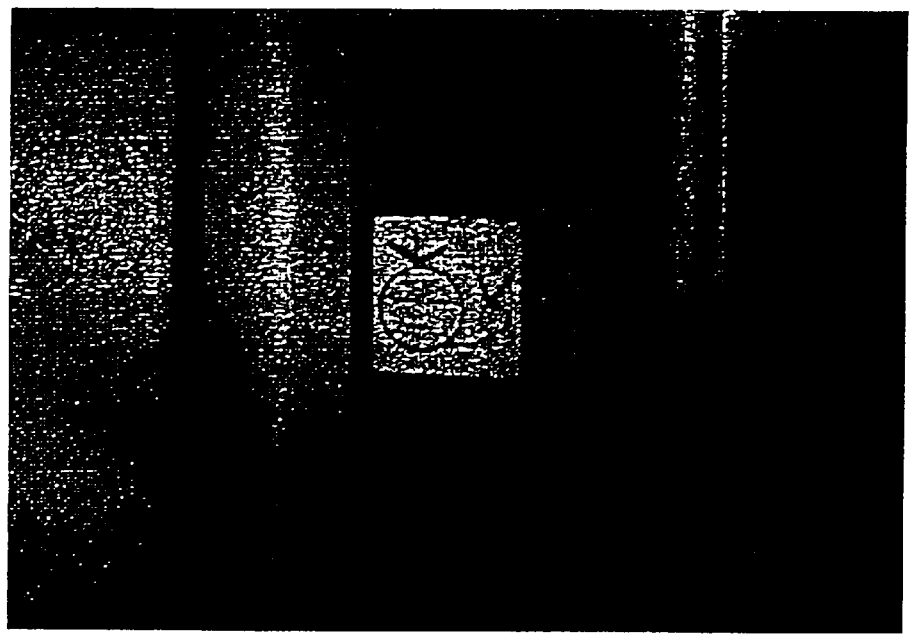
FIGS. 3 and 4 are photographs showing an image created by the EL device according to the first embodiment of the present invention, respectively.
Figure 4:
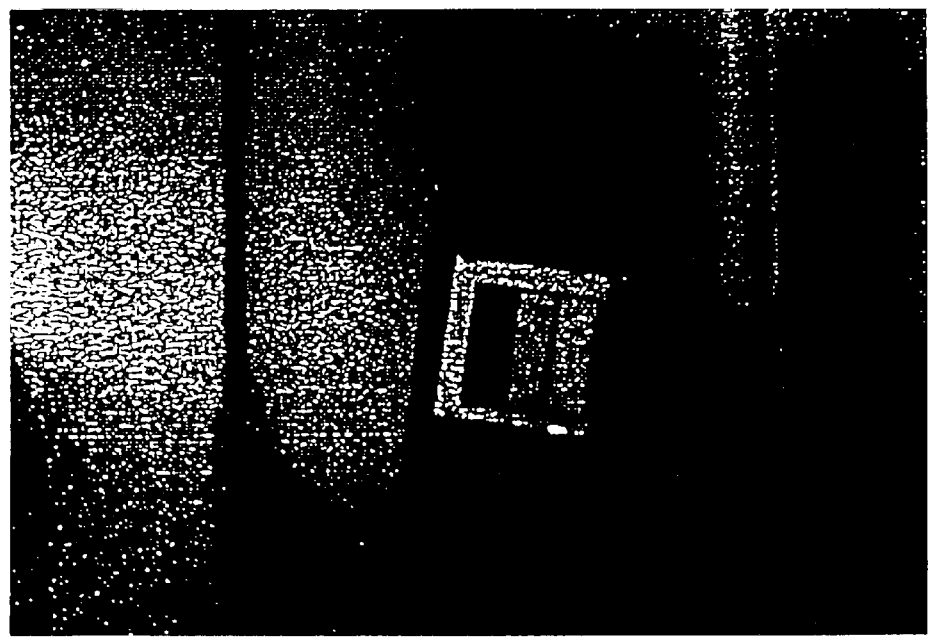

In the organic EL device thus completed, the region subjected to the photo-oxidation constitutes a non-light emitting region so that a pattern capable of revealing an image favorably can be formed as shown in FIGS. 3 and 4.

Figure 5:
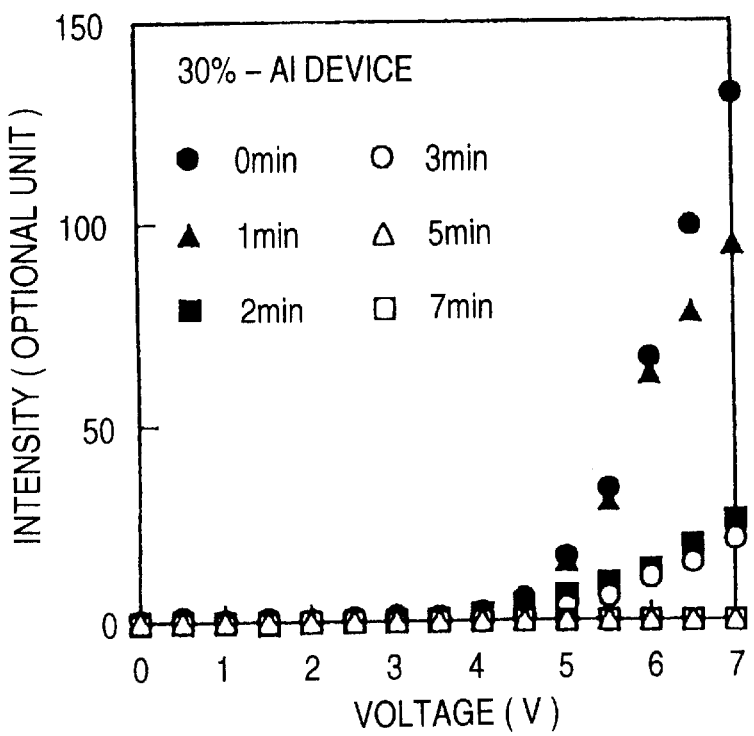
FIG. 5 is a graph showing the relationship between a photo-irradiation time and light emission intensity in the EL device according to the first embodiment of the present invention.

FIG. 5 shows the relationship between a driving voltage and a light emission intensity for a selectively oxidized region which was measured when the photo-irradiation time is gradually changed like 0, 1, 2, 3, 5 and 7 minutes. As understood from FIG. 5, when the photo-irradiation time is long enough, the light emission almost disapear. This means that the light emitting layer has lost the function of light emission by the selective photo-oxidation.

Figure 6:
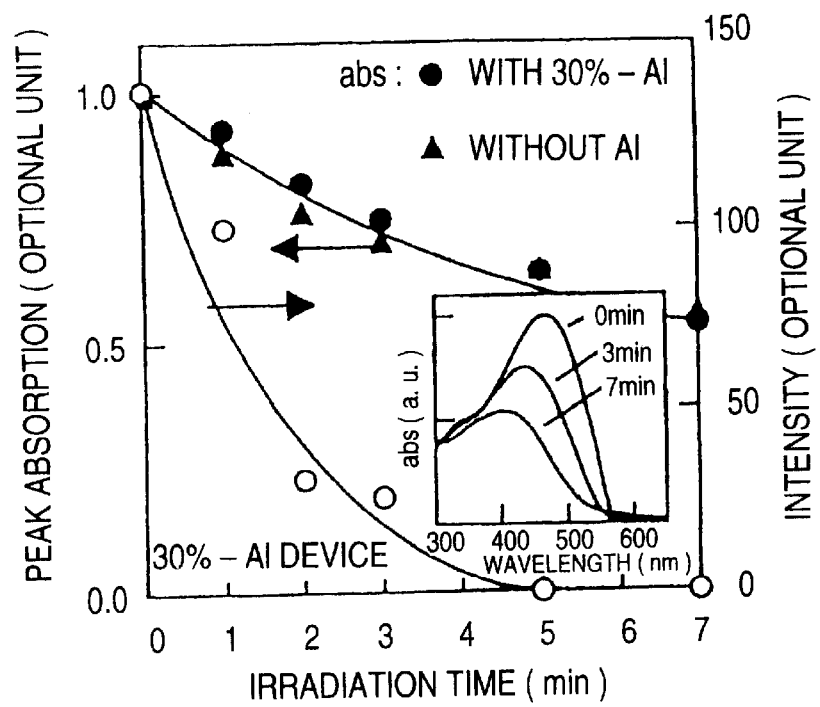
FIG. 6 is a graph showing the relationship between a photo-irradiation time and light emission intensity in the EL device when an aluminum electrode is formed or not formed.

FIG. 6 shows the relationship between photo-irradiation time and optical absorption intensity in the photo-irradiated region when the aluminum electrode is formed or not formed. As seen from FIG. 6, the degree of photo-oxidation does not vary greatly whether the Al electrode is formed or not.

Figure 7:
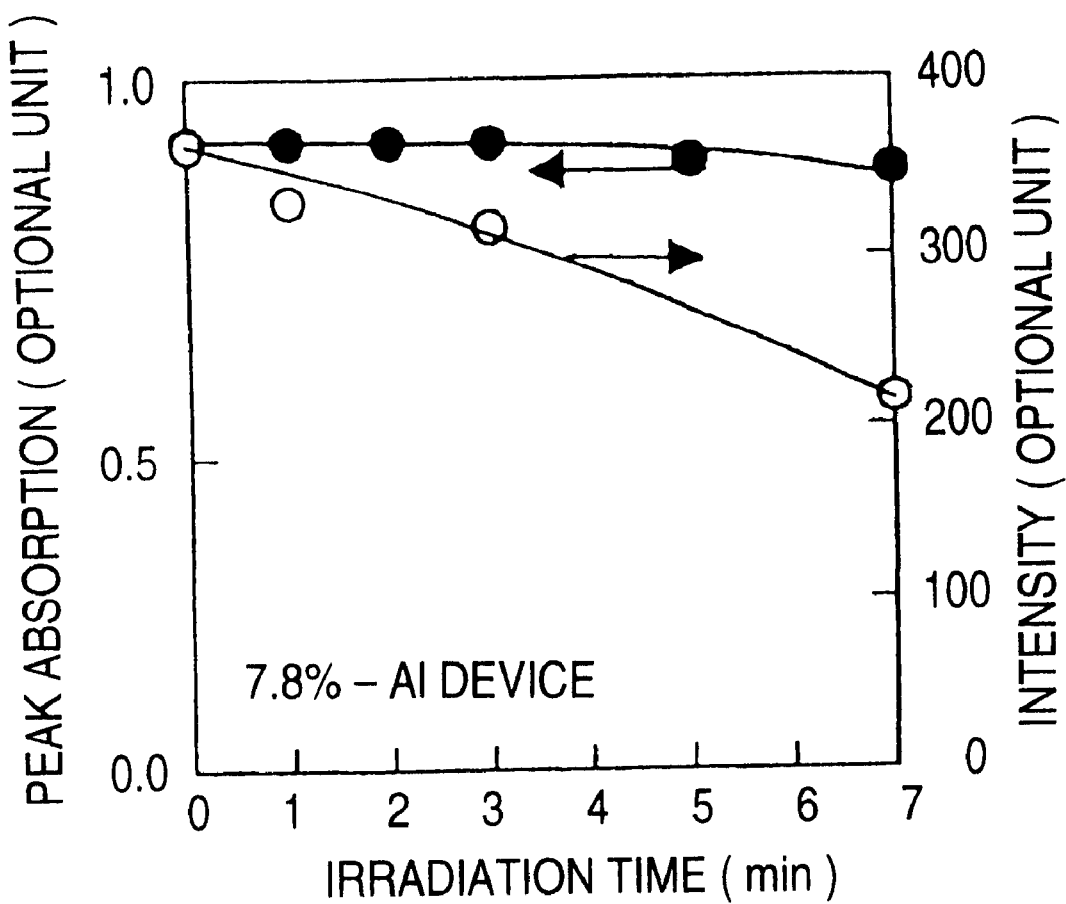
FIG. 7 is a graph showing the relationship between a photo-irradiation time and light emission intensity in the EL device when an aluminum electrode with low transmittance is used.

FIG. 7 shows the relationship between photo-irradiation time and optical absorption intensity in the photo-irradiated region after the aluminum electrode having a thickness increased about twice to provide transmittance of 7.8% has been formed. As understood from FIG. 7, the degree of reduction in the light emission intensity decreases as the oxygen transmittance of the Al electrode lowers. This reduces the contrast of image when the patterning has been made.

Embodiment 2

Figure 8:
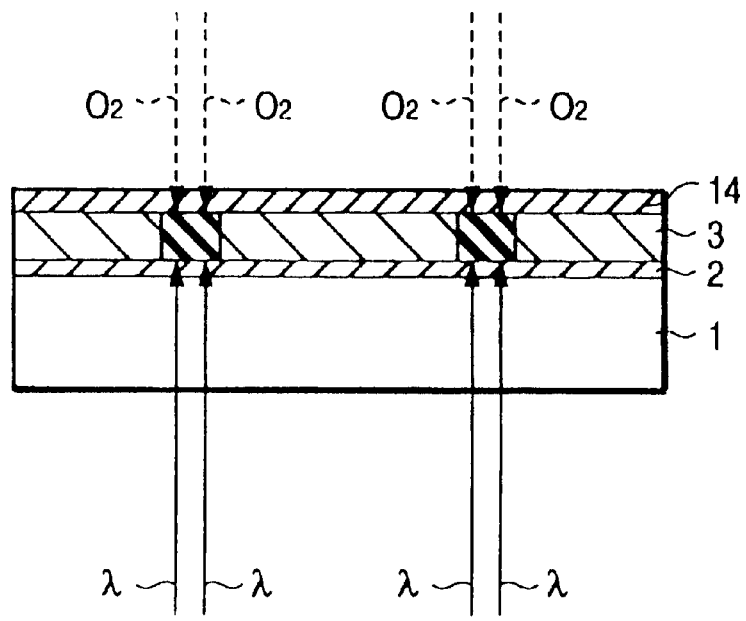
FIG. 8 is a sectional view of an organic EL device according to the second embodiment of the invention.

In the first embodiment, the second electrode is made of a light-transmittable material, and the photo-irradiation for patterning was made from the side of the second electrode. On the other hand, in this embodiment, as shown in FIG. 8, the second electrode is made of a light-tight and porous conductive film 14 of iridium having a thickness of several hundreds of angstrom, and the non-light-emitting region is formed through the photo-oxidation due to invasion of oxygen from the side of the second electrode and photo-irradiation from the side of the substrate. The remaining portion is formed in the same manner as the first embodiment. The iridium oxide layer had an opening rate of about 50%.

The organic EL device according to this embodiment can provide the same effect as the first embodiment. In addition, since the second electrode is made of the light-tight material, the entire light can be transmitted from the rear side from the front side, thus further enhancing the luminance. The iridium layer has a pillar-like crystal structure and hence porous so that it is likely to transmit oxygen. The iridium layer is very conductive so that it can be effectively used. Iridium is oxidized so that iridium oxide is deposited around the iridium which is pillar-like crystal to provide an oxygen non-transmittable structure. Thus, the image, which has been once formed, is not deteriorated owing to the transmission of oxygen.

As described above, since iridium has a pillar-like crystal structure, it is porous and is likely to transmit oxygen. Therefore, an oxidation preventive film may be bonded in order to prevent the oxidation of the iridium before the light exposure and may be removed immediate before patterning. In this manner, a better image can be formed. Accordingly, the material such as iridium may be used as the electrode material, which itself has a porous structure and is reduced in its porosity degree when it is oxidized, thereby impeding oxygen from being passed. Thus, after the pattern has been formed, the light emitting layer can be prevented from being deteriorated, thus lengthening the life.

Embodiment 3

An explanation will be given of the third embodiment of the present invention.

Figure 9:
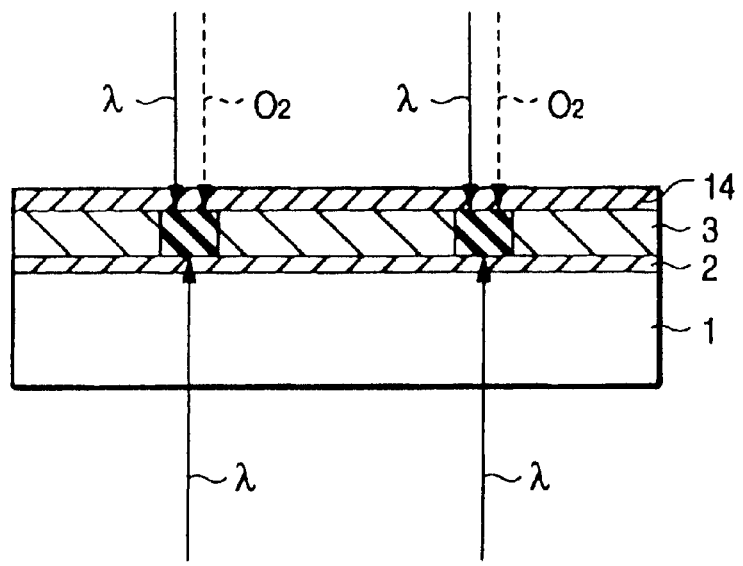
FIGS. 9 an 10 are sectional views of an organic EL device according to the third embodiment of the present invention.

In the first embodiment, the second electrode is made of a light-transmittable material, and the photo-irradiation for patterning was made from the side of the second electrode. On the other hand, in this embodiment, as shown in FIG. 9, the second electrode is made of an aluminum electrode 4 having transmittance of 30%, and the patterning can be made by the photo-irradiation from both sides.

In this configuration, since the non-light-emitting region is formed by the light exposure from both sides, without increasing a pattern size, the pattern for a mask pattern can be formed with great accuracy.

Embodiment 4

Figure 10:
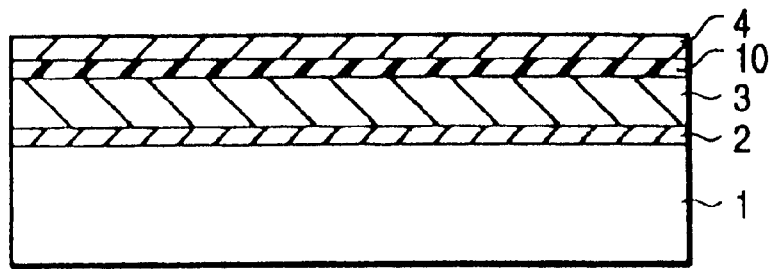

An explanation will be given of the fourth embodiment of the present invention. In the first to third embodiments, the second electrode was made of an oxygen-transmittable material, and oxygen for patterning can be externally supplied through the second electrode. On the other hand, as shown in FIG. 10, prior to forming the second electrode, an iridium oxide layer 10 having a thickness of 10 nm, which serves as an oxygen supplying layer, is formed on the surface of the light emitting layer 3. The remaining region is formed in the same fashion as the first embodiment as shown in FIG. 1. In this embodiment, the light exposure by infrared rays (IR) and ultraviolet rays (UV) is made for patterning. Through such light exposure, the iridium oxide layer 10 in the vicinity of the surface of the light emitting layer 3 is excited and heated so that the oxygen atoms are liberated and the light emitting layer is oxidized by optical energy into an oxidized region, thereby forming a non-light-emitting region.

Figure 11:
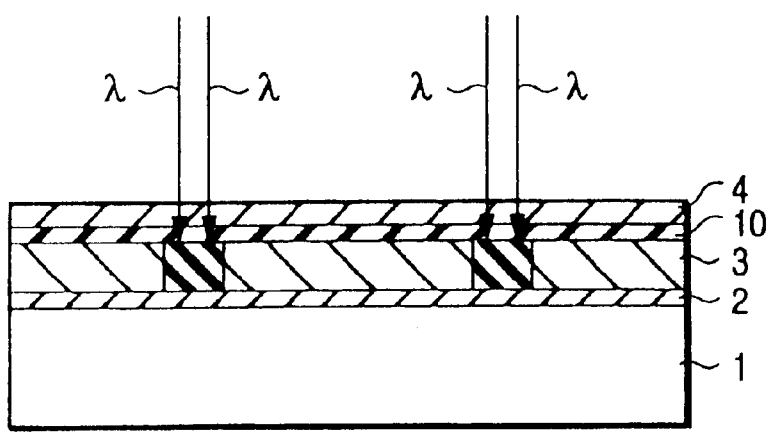
FIGS. 11 and 12 are sectional views of a modification of the organic EL device according to the third embodiment of the present invention.

FIG. 11 shows an organic EL device after the patterning.

In this configuration, oxygen is not supplied externally, but the oxygen supplying layer is previously formed. Light beams excite this layer to generate oxygen.

Figure 12:
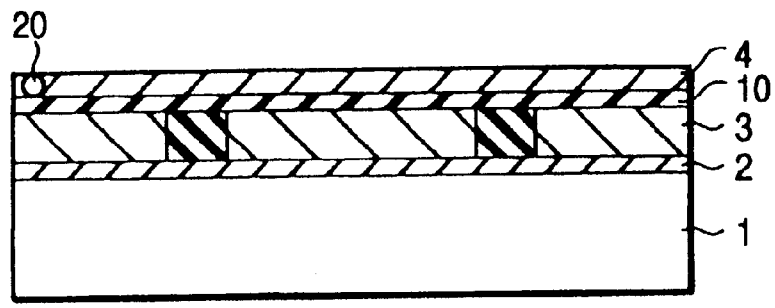

In this way, the light emitting pattern can be easily formed only by the step of light exposure by electron beams.

Where emission of the oxygen from the oxygen supplying layer is problematic after the patterning, as shown in FIG. 12, an oxygen adsorption material 20 may be embedded in a capsule shape. In this case, the capsule is finally broken in a non-contact manner by energy supply from the exterior, thus giving the effect of oxygen removal.

Although the surface of the second electrode may be unchanged, a protective film may be formed afterward.

The material for making the light emitting layer should not be limited to those identified in the embodiments described above, but may be generally an organic electric-field light-emitting material which can be photo-oxidized. Specifically, the material may be "conjugated high polymer" of which the main chain has a successively repetitive structure of a saturated (single) coupling and non-saturated (double or triple) coupling of carbon atoms, fluorescent dye and its high polymer containing it in its molecular structure, or the material with the above high polymer and fluorescent dye dispersed in an insulating high. polymer. The conjugated high polymer includes the above MDOPPV; Poly(p-phenylene vinylene: PPV) and its derivatives inclusive of (Poly (2-methoxy-5-(2'-ethylhexyloxy)-p-phenylene vinylene), Poly(2,5-dioctyloxy-p-phenylene vinylene), Poly(2,5-dinonyloxy-p-phenylene vinylene), Poly(2,5-didecyloxy-p-phenylene vinylene) etc.; Polythiophene and its derivatives inclusive of Poly(3-hexylthiophene), Poly(3-ocylthiophene), Poly(3-nonylthiophene), Poly(3-decylthiophene), Poly(3-undecylthiophene), Poly(3-dedecylthiophene), Poly [3-dodecylphenyl)thiophene], etc.; Polyfluorene and its derivatives inclusive of Poly(9,9-dihexylfluorene), Poly(9, 9-diheptylfluorene), Poly(9,9-dioctylfluorene), Poly(9,9-didecylfluorene), Poly([9,9-bis(p-hexylphenyl)fluorene]], Poly[9,9-bis(p-heptylphenyl)fluorene], Poly[9,9-bis(p-octylphenyl)fluorene], etc.; derivatives of Polyacetylene inclusive of Poly(1,2-diphenylacetylene), Poly[1-phenyl-2-(p-butylphenyl)acetylene, Poly(1-methyl-2-phenylacetylene, Poly(1-ethyl-2-phenylacetylene), Poly(1-hexyl-2-phenylacetylene), Poly(phenylacetylene), etc.; and Polypyridine, Poly(pyridyl vinylene), Polyphenylene, Polyfurane, Polyselenophene, Poly(phenylene-co-thienylene), Poly[1,4-bis (2-thienyl)phenylene], Poly(phenyleneetynylene) and their derivatives. The fluorescent dye includes Tris(8-hydroxyquinoline) aluminum (Alq), 3-(2-Benzothiazolyl)-7-(diethlyamino) coumarin(Coumarin 6), 3-(2-Benzoimidazolyl)-7-(diethylamino)coumarin) (Coumarin 7), 4-(Dicyanometylene)-2-methyl-6-(4-dimethylaminostyryl)-4H-pyral)(DCM), Nile Red, 1,1,4,4-Tetraphenyl-1,3-butadiene, N,N'-Dimetylquinacrydone (DMQA), 1,2,3,4,5-Pentaphenylcyclopentadiene(PPCP), N, N'-Diphenyl-N, N'-bis(3-methylphenyl)-1,1'-biphenyl-4-4'-diamine (TPD), 2-(4-Biphenyl)-5-(4-tert-butylphenyl)-1,3,4-oxydiazole (PBD), p-Terpheyl, p-Quaterphenyl, 2,2'-Bithiophene, 2,2':5,2"-Terthiophene, α-Hexathiophene, antracene, tetracene, phthalocyanene, porphyrin, etc. The insulating high polymer includes Poly(N-vinylcarbazole) (PVK), Poly (methlymethacrylate) (PMMA), Polycarbonate, Polystylene, Poly(methylphenylsilane), Poly(diphenylsilane), etc.

The light emitting layer can be suitably selected so that a color image can be formed in a single-layer structure or a multiple-layer structure.

In the first to third embodiments, the first electrode may be a transparent conductive thin film made of, in place of ITO, conductive oxide inclusive of $SnO_2$:Sb (NESA), $SnO_2$:F, $CdIn_2O_4$ (CIO), $CdSnO_4$(CTO), ZnO, $RuO_2$, $IrO_2$, etc., or conductive high polymer inclusive of polypyrole, polyaniline, polythiophene, poly(3,4-ethylene dioxithiophene) (PEDOT), polyisothianaphthene. Further, the first electrode may be a semi-transparent metallic film made of Al, Mg, Ca, Au, Ag, Pt, In, Cu, Nd, Ni, Sn, etc.

The second electrode should not be limited to the thin film of Al, but may be a porous metallic thin film of Ca, Au, Ag, Pt, In, Cu, Nd, etc., and may be made of $IrO_2$, polypyrrole, polyaniline, polythiophene, poly(3,4-ethyelene dioxithiophene) (PEDOT), polyisothianaphthene, etc. which can be made so porous as to transmit oxygen according to a deposition condition.

In the fourth embodiment, the electrodes may be made of any material as long as they are a conductive thin film. The oxygen supply source should not be limited to iridium oxide ($IrO_2$), but may be made of a material which can emit oxygen through the excitation by relatively small energy, e.g. silver oxide ($Ag_2O$), chrome oxide ($CrO_2$), ruthenium oxide ($RuO_2$), etc.

In the embodiments described above, a structure in which the light emitting layer intervenes between the first and the second electrode was adopted. However, another structure in which an electron injecting layer or a hole injecting layer intervenes between the light emitting layer and these electrodes may be adopted. In this case, the light emitting layer, in which no oxidized region is formed, may be left as it is, and the non-light-emitting region formed by selective photo-oxidation may be formed in the electron injecting region or hole injecting region.

Another layer such as a buffer layer may be formed between the substrate and the first electrode layer, or between the respective layers.

What is claimed is:

1. An organic electroluminescence device comprising:
   a substrate;
   a first electrode formed on the substrate;
   a light emitting layer formed on the first electrode; and
   a second electrode formed on the light emitting layer and made of an oxygen-transmittable material, wherein the light-emitting layer includes an oxide layer selectively formed by the selective photo-oxidation using light and oxygen reached through the second electrode, and the oxide layer serves as a non-light-emitting region.

2. An organic electroluminescence device according to claim 1, wherein said substrate is made of a light-transmittable material and said first electrode is also made of a light transmittable material; and said non-light-emitting region is formed through invasion of oxygen from the side of the second electrode and photo-oxidation based on photo-irradiation from the side of said substrate.

3. An organic electroluminescence device according to claim 1, wherein said second electrode is made of a light-transmittable material and said non-light-emitting region is formed by photo-oxidation using light transmitted through said second electrode.

4. An organic electroluminescence device according to claim 1, wherein said second electrode is made of a light-transmittable material, and said non-light-emitting region is formed by photo-oxidation using light transmitted through said second electrode and light from the side of said substrate.

5. An organic electroluminescence device according to any one of claims 1 to 4, wherein said second electrode is made of aluminum.

6. An organic electroluminescence device according to claim 5, wherein said second electrode has light transmittance of 30% or higher to visible light.

7. An organic electroluminescence device according to claim 1, wherein said second electrode is made of a light-tight conductive film having an opening diameter enough to transmit oxygen molecules.

8. An organic electroluminescence device comprising:
   a substrate;
   a first electrode formed on the substrate;
   a light emitting layer formed on the first electrode; and
   a second electrode formed on the light emitting layer; and
   an oxygen supplying layer which is formed within said light-emitting layer or in the vicinity of said light-emitting layer and can supply oxygen to said light-emitting layer, wherein the light-emitting layer includes an oxide layer selectively formed by the selective photo-oxidation using light and oxygen reached through the second electrode, and the oxide layer serves as a non-light-emitting region.

9. A board for a display device comprising:
   a substrate;
   a first electrode formed on the substrate;

a light emitting layer formed on the first electrode; and a second electrode formed on the light emitting layer, wherein said second electrode is made of a porous thin film enough to transmit oxygen, and the light-emitting layer is designed to provide an oxide layer selectively formed by the selective photo-oxidation using photo-irradiation and oxygen reached through the second electrode, said oxide layer serves as a non-light-emitting region.

10. A board for a display device according to claim 9, wherein said second electrode is made of a light-transmittable porous thin film enough to transmit oxygen and light, wherein said light-emitting layer is designed to provide an oxide layer selectively formed by the selective photo-oxidation using photo-irradiation from the side of said second electrode and oxygen reached through the second electrode, said oxide layer constituting a non-light-emitting region.

11. A board for a display device according to claim 9, wherein said second electrode is made of a light-tight porous thin film enough to transmit oxygen, said substrate is made of a light-transmittable material, said first electrode is made of a light-transmittable material and said light-emitting layer is designed to provide an oxide layer selectively formed by the selective photo-oxidation using photo-irradiation from the side of the first electrode and oxygen reached through the second electrode, said oxide layer serving as a non-light-emitting region.

12. A board for a display device comprising:

a substrate;

a first electrode formed on the substrate;

a light emitting layer formed on the first electrode;

a second electrode formed on the light emitting layer; and an oxygen supplying layer which is formed within said light-emitting layer or in the vicinity of said light-emitting layer and can supply oxygen to said light-emitting layer, wherein the light-emitting layer is designed to provide an oxide layer selectively formed by the selective photo-oxidation using photo-irradiation and oxygen reached through the second electrode, the oxide layer serving as a non-light-emitting region.

13. A board for a display device according to claim 12, wherein said second electrode is made of aluminum.

14. A board for a display device according to claim 12, wherein said second electrode has light transmittance of 30% or higher to visible light.

\* \* \* \* \*